(12) United States Patent
Mustafa et al.

(10) Patent No.: US 11,732,358 B2
(45) Date of Patent: Aug. 22, 2023

(54) HIGH TEMPERATURE CHEMICAL VAPOR DEPOSITION LID

(71) Applicant: Applied Materials, Inc., Santa Clara, CA (US)

(72) Inventors: Muhannad Mustafa, Milpitas, CA (US); Muhammad M. Rasheed, San Jose, CA (US); Mario D. Sanchez, San Jose, CA (US); Srinivas Gandikota, Santa Clara, CA (US); Wei V. Tang, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/889,930

(22) Filed: Aug. 17, 2022

(65) Prior Publication Data

US 2022/0389585 A1  Dec. 8, 2022

Related U.S. Application Data

(62) Division of application No. 17/350,073, filed on Jun. 17, 2021, now Pat. No. 11,447,866.

(60) Provisional application No. 63/040,492, filed on Jun. 17, 2020.

(51) Int. Cl.
| | | |
|---|---|---|
| C23C 16/40 | (2006.01) | |
| C23C 16/455 | (2006.01) | |
| C23C 16/52 | (2006.01) | |
| C23C 16/50 | (2006.01) | |

(52) U.S. Cl.
CPC ...... *C23C 16/45565* (2013.01); *C23C 16/455* (2013.01); *C23C 16/45536* (2013.01); *C23C 16/50* (2013.01); *C23C 16/52* (2013.01)

(58) Field of Classification Search
CPC .......... C23C 16/45565; C23C 16/455; C23C 16/45536; C23C 16/50; C23C 16/52; C23C 16/4412
USPC ........ 118/715; 156/345.33, 345.34; 427/569, 427/570, 533, 535, 96.8, 237, 248.1, 427/255.23, 255.28; 216/58, 67
See application file for complete search history.

(56) References Cited

U.S. PATENT DOCUMENTS

| | | | |
|---|---|---|---|
| 5,746,417 A | 5/1998 | Bowers et al. | |
| 6,156,151 A * | 12/2000 | Komino | H01J 37/3244 118/723 R |
| 7,267,725 B2 * | 9/2007 | Kawano | C23C 16/54 156/345.31 |

(Continued)

FOREIGN PATENT DOCUMENTS

| | | |
|---|---|---|
| JP | 2000306884 A | 11/2000 |
| WO | 2007016592 A2 | 2/2007 |
| WO | 2008004232 A2 | 1/2008 |

OTHER PUBLICATIONS

PCT International Search Report and Written Opinion in PCT/US2021/037736 dated Oct. 1, 2021, 11 pages.

*Primary Examiner* — Rudy Zervigon
(74) *Attorney, Agent, or Firm* — Servilla Whitney LLC

(57) ABSTRACT

Process chamber lids, processing chambers and methods using the lids are described. The lid includes a pumping liner with a showerhead, blocker plate and gas funnel positioned therein. A liner heater is positioned on the pumping liner to control temperature in the pumping liner. Gas is flowed into the gas funnel using a dead-volume free one-way valve with a remote plasma source.

15 Claims, 5 Drawing Sheets

(56) References Cited

U.S. PATENT DOCUMENTS

| | | | |
|---|---|---|---|
| 7,276,123 B2* | 10/2007 | Shimizu | C23C 16/4585 156/345.31 |
| 7,569,191 B2 | 8/2009 | Ganguli et al. | |
| 7,611,124 B2 | 11/2009 | Shindo | |
| 7,712,434 B2* | 5/2010 | Dhindsa | H01J 37/32724 156/345.43 |
| 8,092,598 B2* | 1/2012 | Baek | C23C 16/4412 156/345.33 |
| 8,152,925 B2* | 4/2012 | Iizuka | H01J 37/32623 118/715 |
| 8,372,201 B2* | 2/2013 | Provencher | C23C 16/45561 156/345.33 |
| 8,506,713 B2* | 8/2013 | Takagi | C23C 16/409 118/728 |
| 8,734,663 B2* | 5/2014 | Smargiassi | H01L 21/67115 118/725 |
| 8,945,306 B2* | 2/2015 | Tsuda | C23C 16/45544 156/345.33 |
| 9,017,481 B1* | 4/2015 | Petti | C23C 16/45565 118/724 |
| 9,340,874 B2* | 5/2016 | Halpin | H01L 21/67126 |
| 9,484,190 B2* | 11/2016 | Glukhoy | H01J 37/32091 |
| 9,487,863 B2* | 11/2016 | Matsui | C23C 16/4412 |
| 9,732,421 B2* | 8/2017 | Kamakura | C23C 16/4412 |
| 9,885,112 B2* | 2/2018 | Tsuji | H01J 37/3244 |
| 9,892,908 B2* | 2/2018 | Petti | C23C 16/4557 |
| 9,963,782 B2* | 5/2018 | Tsuji | C23C 16/4412 |
| 10,358,721 B2* | 7/2019 | Kim | C23C 16/45544 |
| 10,714,315 B2* | 7/2020 | White | H01J 37/32449 |
| 10,832,903 B2* | 11/2020 | Petti | H01J 37/32532 |
| 10,858,737 B2* | 12/2020 | White | C23C 16/45565 |
| 10,872,803 B2* | 12/2020 | White | C23C 16/4584 |
| 10,872,804 B2* | 12/2020 | White | C23C 16/45565 |
| 10,934,619 B2* | 3/2021 | Kim | C23C 16/45542 |
| 11,001,925 B2* | 5/2021 | Kim | C23C 16/52 |
| 11,110,425 B2* | 9/2021 | Lee | C23C 16/45565 |
| 11,171,025 B2* | 11/2021 | Jeong | H01L 21/6719 |
| 11,222,772 B2* | 1/2022 | Kim | C23C 16/45548 |
| 11,251,068 B2* | 2/2022 | Roh | H01L 21/68764 |
| 11,584,993 B2* | 2/2023 | Lee | C23C 16/45565 |
| 2001/0000759 A1* | 5/2001 | Doley | C23C 16/4401 438/909 |
| 2001/0042511 A1* | 11/2001 | Liu | H01J 37/32642 156/345.47 |
| 2003/0041802 A1* | 3/2003 | Tanaka | C23C 16/4412 118/715 |
| 2003/0143328 A1* | 7/2003 | Chen | C23C 16/452 156/345.43 |
| 2004/0221808 A1* | 11/2004 | Kawano | F16J 15/0887 118/715 |
| 2005/0022737 A1* | 2/2005 | Shimizu | C23C 16/4585 118/715 |
| 2005/0098111 A1* | 5/2005 | Shimizu | C23C 16/4409 118/715 |
| 2005/0208217 A1* | 9/2005 | Shinriki | H01J 37/3244 156/345.33 |
| 2005/0238464 A1 | 10/2005 | Matsuoka et al. | |
| 2006/0102076 A1 | 5/2006 | Smith et al. | |
| 2007/0218701 A1* | 9/2007 | Shimizu | H01L 21/67748 438/758 |
| 2008/0202416 A1* | 8/2008 | Provencher | C23C 16/45544 118/715 |
| 2008/0318417 A1* | 12/2008 | Shinriki | H01L 23/53295 438/650 |
| 2010/0279008 A1* | 11/2010 | Takagi | H01L 21/02197 118/725 |
| 2011/0073038 A1 | 3/2011 | Chien et al. | |
| 2011/0223334 A1 | 9/2011 | Yudovsky et al. | |
| 2011/0253257 A1 | 10/2011 | Fass et al. | |
| 2012/0145078 A1* | 6/2012 | Huang | C23C 16/4412 239/548 |
| 2013/0129577 A1* | 5/2013 | Halpin | C23C 16/4409 422/236 |
| 2014/0000843 A1* | 1/2014 | Dunn | H01L 21/67109 165/80.5 |
| 2014/0036274 A1* | 2/2014 | Marquardt | G01B 11/14 219/385 |
| 2014/0103145 A1* | 4/2014 | White | H01J 37/32449 239/548 |
| 2014/0150878 A1 | 6/2014 | Merry et al. | |
| 2015/0004798 A1* | 1/2015 | Chandrasekharan | C23C 16/4409 438/758 |
| 2015/0187568 A1* | 7/2015 | Petti | C23C 16/4557 118/724 |
| 2016/0153088 A1* | 6/2016 | Tsuji | C23C 16/4408 118/728 |
| 2016/0237559 A1* | 8/2016 | Tsuji | H01J 37/32834 |
| 2016/0312360 A1 | 10/2016 | Rasheed et al. | |
| 2016/0355928 A1* | 12/2016 | Toriya | C23C 16/45544 |
| 2017/0051402 A1* | 2/2017 | Mori | H01L 21/67103 |
| 2018/0076032 A1 | 3/2018 | Wang et al. | |
| 2019/0139807 A1* | 5/2019 | White | C23C 16/4412 |
| 2020/0066572 A1* | 2/2020 | AuBuchon | H01L 21/68771 |
| 2020/0090978 A1* | 3/2020 | AuBuchon | H01L 21/67017 |

* cited by examiner

HIGH TEMPERATURE CHEMICAL VAPOR DEPOSITION LID

CROSS-REFERENCE TO RELATED APPLICATIONS

This application is a Divisional Application of U.S. application Ser. No. 17/350,073, filed on Jun. 17, 2021, which claims priority to U.S. Provisional Application No. 63/040,492, filed on Jun. 17, 2020, the entire disclosures of which are hereby incorporated by reference herein.

TECHNICAL FIELD

Embodiments of the disclosure generally relate to isolation valves. In particular, embodiment of disclosure relate to isolation valves for semiconductor manufacturing with reduced dead volumes.

BACKGROUND

Gas flow paths including various valves are common in the semiconductor manufacturing industry. Current flow path configurations have dead volumes that require a purge to prevent process gas back flow in the clean gas manifold. This is especially important where reactive gases are employed to prevent gas phase reactions in the gas lines. The reaction products can damage the equipment by chemical reaction or causing clogging.

Additionally, the residue left from gas phase reactions in the process lines can have a substantial negative effect on subsequent processes. The residue may react with subsequent gases or process conditions creating undesired products. The residue can also enter the process space and form particulates on the substrate, damaging the device being manufactured. The manufacturing equipment needs to be subjected to extensive maintenance to remove and replace clogged lines and valves leading to significant downtime and a loss of throughput.

There are a number chemical vapor deposition (CVD) processes that require high temperatures for precursor flow and deposition. Current CVD process chamber lids are not compatible with high deposition processes because precursor can condense in the lower temperature portions of the lid.

Accordingly, there is a need for apparatus and methods for high temperature chemical vapor deposition processes.

SUMMARY

One or more embodiments of the disclosure are directed to process chamber lids comprising a pumping liner, showerhead, blocker plate, gas funnel and liner heater. The pumping liner comprises a body with an inner wall, an outer wall, a top wall and a bottom wall. The body has a lower portion and an upper portion. The inner wall extends around a central axis spaced a first distance from the central axis forming an open central region.

The showerhead is positioned within the lower portion of the pumping liner in the open central region. The showerhead has a front surface and a back surface defining a thickness with a plurality of apertures extending through the thickness.

The blocker plate is positioned within the lower portion of the pumping liner in the open central region. The blocker plate has a front surface and a back surface defining a thickness with a plurality of apertures extending through the thickness. The front surface of the blocker plate is spaced a blocker distance from the back surface of the showerhead.

The gas funnel is positioned within the open central region of the pumping liner. The gas funnel has a front surface, a back surface, an outer wall and an inner wall. The front surface is spaced a funnel distance from the back surface of the blocker plate to form a funnel gap. The gas funnel has an opening extending through the back surface to the front surface.

The liner heater is positioned on the top wall of the pumping liner.

Additional embodiments of the disclosure are directed to processing methods comprising: flowing a first gas through a first inlet line into a gas funnel; flowing a second gas through a second inlet line connected to the first inlet line upstream of the gas funnel, the second gas flowing through a valve configured to allow a flow of gas downstream only; igniting a plasma of the second gas; exhausting gases through a pump liner; and powering a liner heater to control a temperature in the pump liner.

Further embodiments of the disclosure are directed to non-transitory computer readable medium including instructions, that, when executed by a controller of a processing chamber, causes the processing chamber to perform operations of: flowing a gas through a first inlet line; flowing a gas through a second inlet line connected to the first inlet line through a valve configured to allow a flow of gas downstream only; igniting a plasma in the second inlet line; and powering a liner heater to control a temperature in a pump liner.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
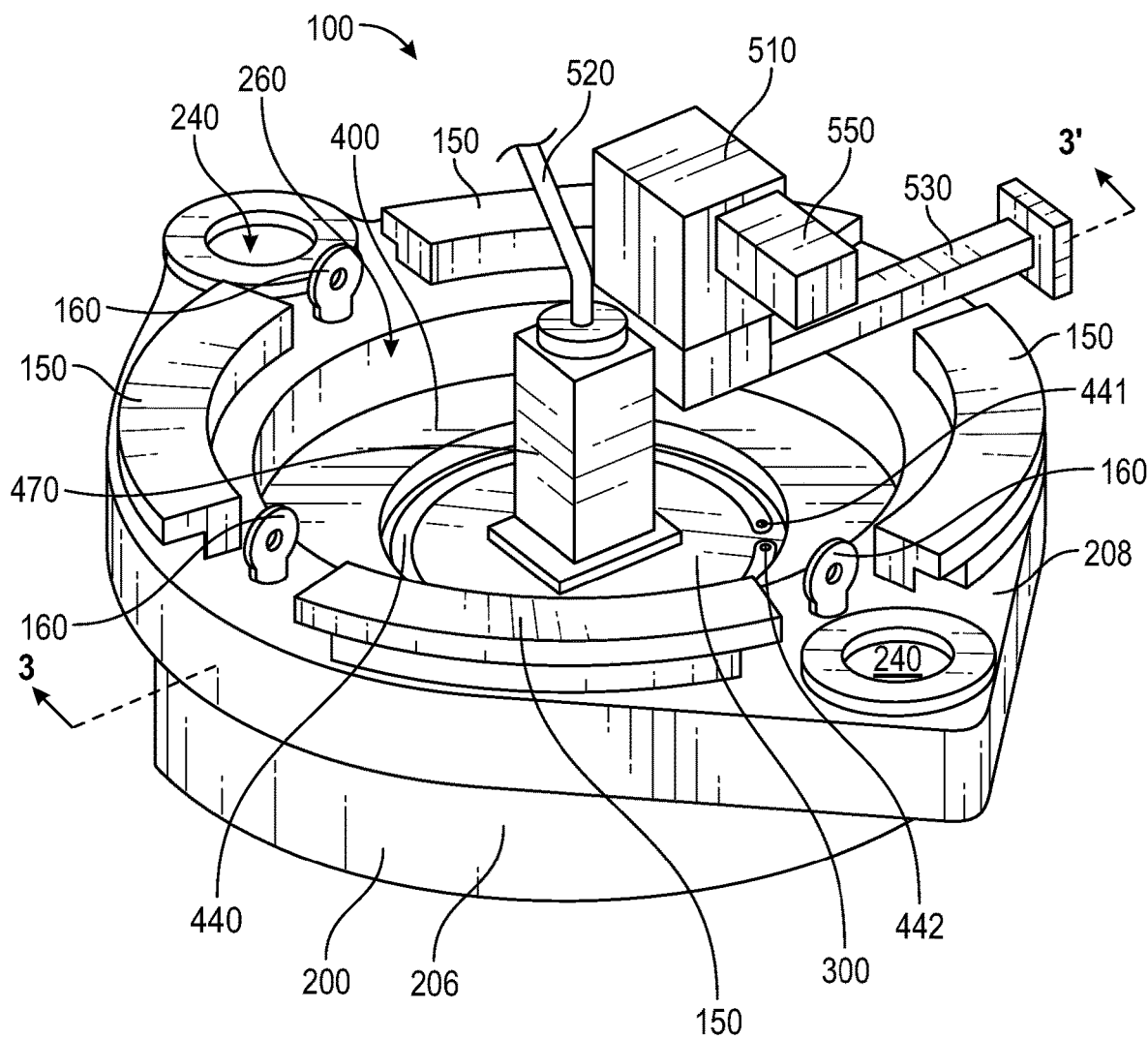
FIG. 1 shows an isometric view of a process chamber lid in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

Some embodiments of the disclosure are directed to methods of depositing metal films by atomic layer deposition (ALD). Some embodiments are directed to ALD tungsten films. Some embodiments incorporate a chemical vapor deposition (CVD) silicon using an integrated environment.

One or more embodiments of the disclosure are directed to deposition chamber lids designed for temperature controller CVD precursor dispensing to the chamber. Some embodiments advantageously provide a deposition chambers with ring heaters and pumping liner heaters for increased temperature control. Some embodiments incorporate dual lid seals to enable high temperature dispensing up to 250° C. Some embodiments advantageously spacer ring added to the deposition lid for variable process spacing. Some embodiments incorporate thick showerheads and blocker plates designed to avoid warpage during high temperature processes as well as to ensure uniform temperature distribution.

One or more embodiments of the disclosure are directed to deposition chambers incorporating pumping liners where the lid station is mounted. The pumping liner of some embodiments has two outlets to be connected with foreline (exhaust). In some embodiments, the shower head, blocker plate and lid station are stacked together. In one or more embodiments, screw ports are sealed with O-rings to isolate the vacuum environment.

In some embodiments, a plurality of heater plates is mounted on the pumping liner. In some embodiments, each heater is rated for 300 W. In some embodiments, each heater is independently controllable. In one or more embodiments, a ring heater is also mounted on the lid station. In some embodiments, the lid station ring heater has a maximum power rating of 1500 W.

In some embodiments, top and bottom manifolds are mounted on the lid station with dual seals. In some embodiments, manifolds have three delivery ports: top port for main precursor delivery, a side port for purge gas and a bottom port is for plasma cleaning radicals. In some embodiments, a spacer ring is sandwiched between the lid station and pumping liner with dual seals. In some embodiments, a differential pumping line is connected to the lid to pump down air trapped between the two seals.

Figure 2:
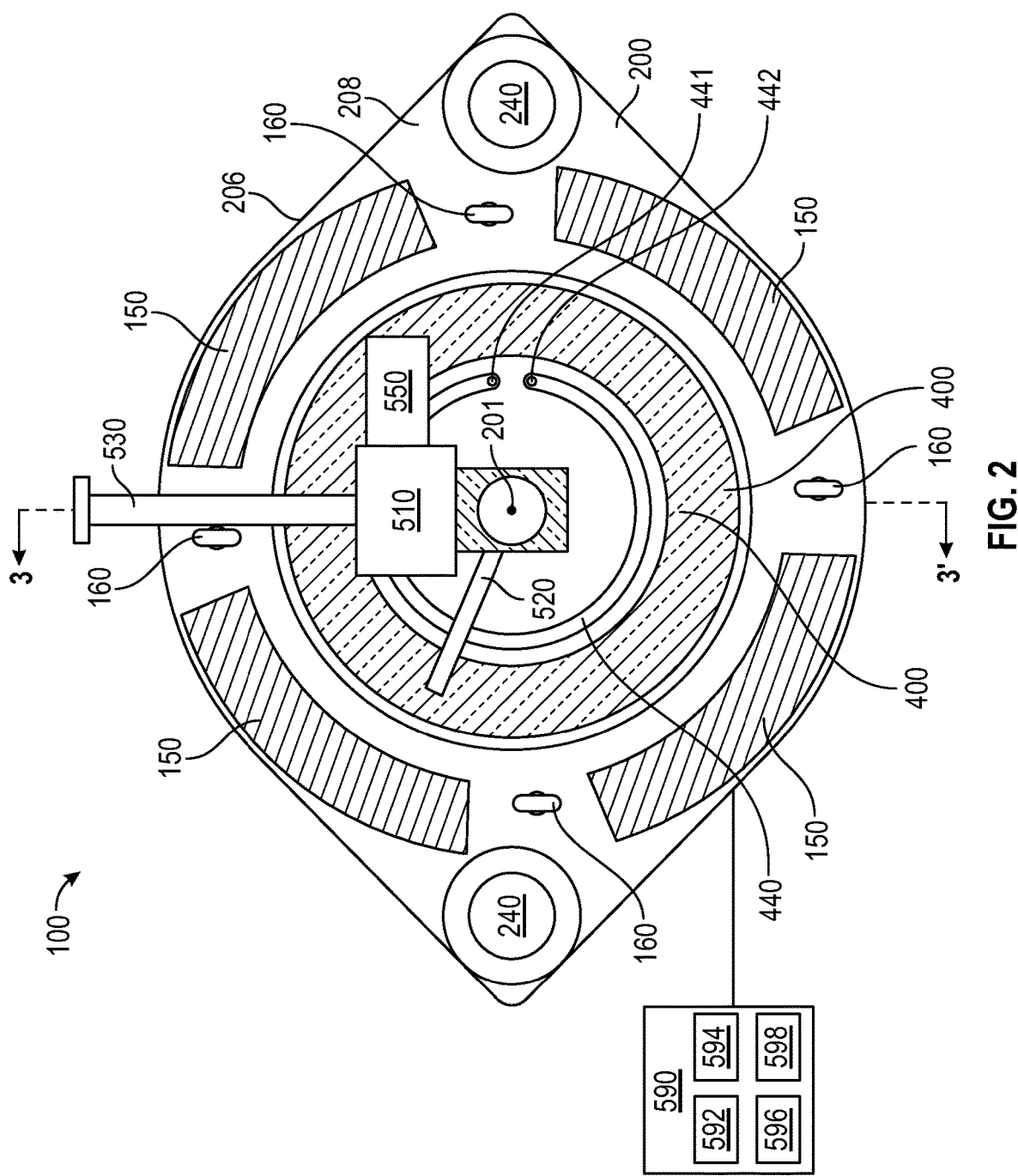
FIG. 2 shows a top view of a process chamber lid in accordance with one or more embodiment of the disclosure.
Figure 3:
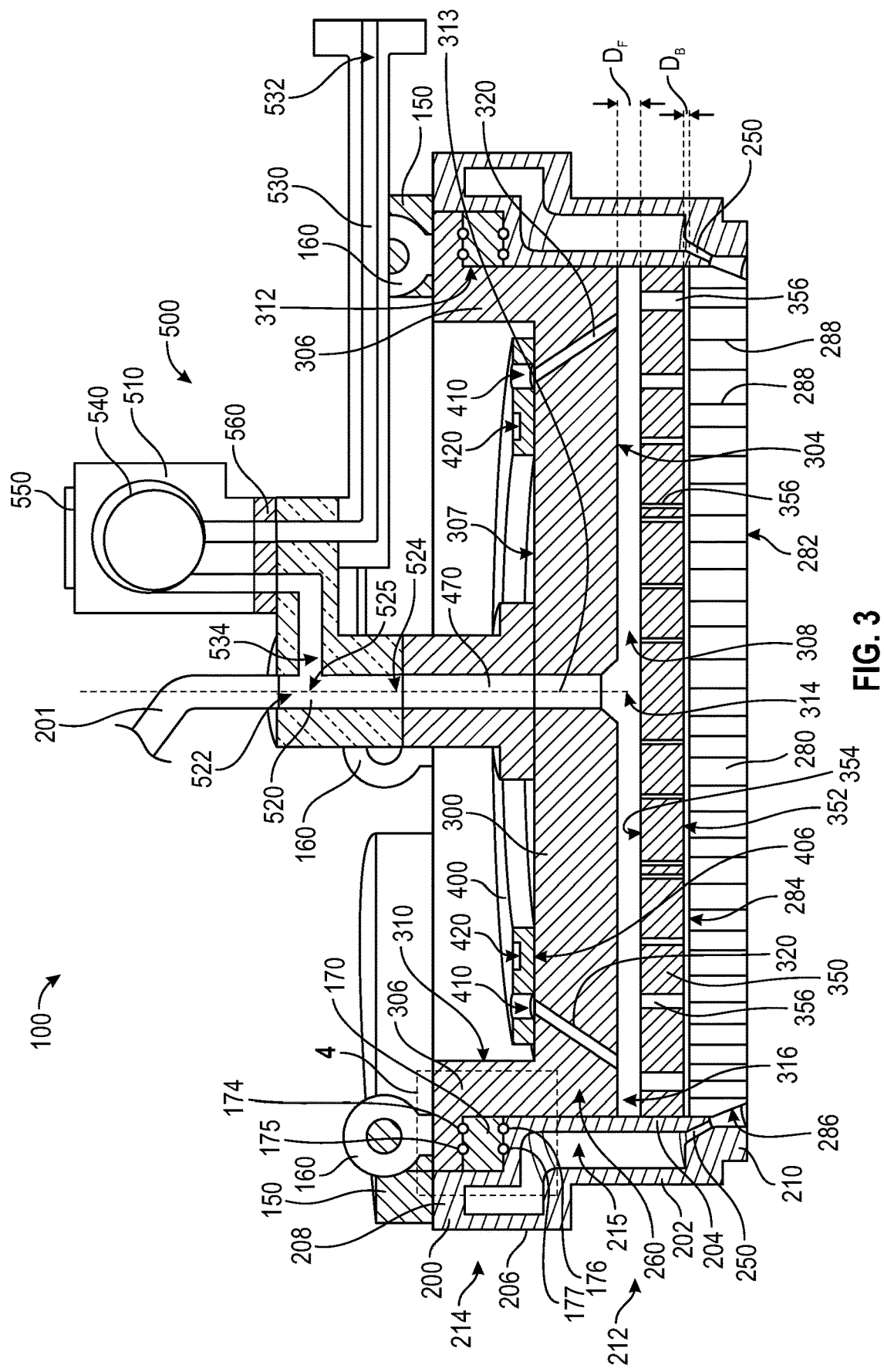
FIG. 3 shows a cross-sectional view of process chamber lid in accordance with one or more embodiment of the disclosure.

Accordingly, one or more embodiments of the disclosure are directed to process chamber lid 100 configured for high temperature gas delivery. FIG. 1 illustrates an isometric view of a process chamber lid 100 according to one or more embodiment of the disclosure. FIG. 2 illustrates a top view of the process chamber lid 100 of FIG. 1. FIG. 3 illustrates a cross-sectional view of the process chamber lid 100 shown in FIGS. 1 and 2 taken along line 3-3'. The various shading shown in the Figures is for descriptive purposes only to aid in identification of parts and does not imply any particular material of construction. The process chamber lid 100 includes a pumping liner 200, a gas funnel 300, a blocker plate 350, a showerhead 280 and a liner heater 270 as described herein.

The pumping liners 200 have a body 202 with any suitable shape. In some embodiments, as shown in the Figures, the body 202 has a generally cylindrical body. However, the skilled artisan will recognize that the pumping liner 200 can have any suitable shape depending on, for example, the process chamber lid in which the liner will be used.

The body 202 of the pumping liner 200 has an inner wall 204, an outer wall 206, a top wall 208 and a bottom wall 210. The inner wall 204 has an inner face that extends around the central axis 201 of the body 202 and is spaced a distance from the central axis 201.

In some embodiments, as illustrated in the Figures, the outer wall 206 of the upper portion 214 is further from the central axis 201 than the outer wall 206 of the lower portion 212.

In some embodiments the upper portion 214 of the body 202 comprises at least one exhaust port 240. The exhaust port 240 provides fluid communication with the upper portion 214, or the plenum 215 through the top wall 208. In the embodiment illustrated in the Figures, the body 202 comprises two exhaust ports 240. The skilled artisan will recognize that there can be any suitable number of exhaust ports 240.

In some embodiments, the pumping liner 200 comprises two exhaust ports 240 positioned about 180° apart relative to the central axis 201. Being spaced apart relative to the central axis means that the stated components are at different rotational positions based on the central axis, the distance from the central axis can be the same or different. In some embodiments, there are three exhaust ports 240 positioned about 120° apart relative to the central axis 201. In some embodiments, there are four exhaust ports 240 positioned about 90° apart relative to the central axis 201.

In some embodiments, as shown in the Figures, the outer wall 206 of the upper portion 214 adjacent an exhaust port 240 is further from the central axis 201 than the outer wall 206 of the upper portion 214 about 90° relative to the central axis 201 from the exhaust port 240. Stated differently, in some embodiments, the width (measured from the central axis) of the plenum 215 is greater at the exhaust ports 240 than at about 90° from the exhaust ports 240. In some embodiments, the width of the plenum 215 varies gradually from a local maximum at the exhaust port 240 to a local minimum at the maximum distance from an exhaust port 240. For example, in a symmetrical system in which the exhaust ports are exactly 180° apart, the width of the plenum 215 at 90° from the exhaust port 240 is a local minimum.

In some embodiments, the bottom wall 210 comprises a plurality of apertures 250 extending through the bottom wall 210. The apertures 250 extend from a plenum opening in the bottom surface of the plenum 215 to a bottom opening in the bottom surface or bottom inner surface of the bottom wall 210. In some embodiments, the apertures are angled from an upper end to a lower end of the aperture so that the plenum opening is further from the central axis 201 than the bottom opening.

A showerhead 280 is positioned in the open central region 260 of the pumping liner 200. The showerhead 280 of some embodiments is positioned within the lower portion 212 of the open central region 260 of the pumping liner 200. The showerhead 280 has a front surface 282 and a back surface 284 defining a thickness of the showerhead 280, and an outer peripheral edge 286. A plurality of apertures 288 extend through the thickness of the showerhead 280 and have openings in the front surface 282 and the back surface 284. In some embodiments, the outer peripheral edge 286 of the showerhead 280 has an angled surface aligned with the opening 250 in the bottom wall 210 of the pumping liner 200. The showerhead 280 can be any suitable showerhead known to the skilled artisan with any suitable number of apertures 288 arranged in any suitable configuration.

A blocker plate 350 is positioned in the open central region 260 of the pumping liner 200. The blocker plate 350 of some embodiments is positioned within the lower portion 212 of the open central region 260 of the pumping liner 200. The blocker plate 350 has a front surface 352 and a back surface 354 that define a thickness of the of the blocker plate 350. A plurality of apertures 356 extend through the thickness of the blocker plate 350. The front surface 352 of the blocker plate 350 is spaced a blocker distance $D_B$ from the back surface 284 of the showerhead 280.

The gas funnel 300 is positioned within the open central region 260 of the pumping liner 200. The gas funnel 300 has a front surface 304, sidewalls 306 and a back surface 307. The sidewalls 306 comprise an outer wall 312 and an inner wall 310.

The front surface 304 of some embodiments is spaced a distance DF from the back surface 354 of the blocker plate 350 to form a funnel gap 308. In some embodiments, the funnel gap 308 has a uniform dimension from edge to edge of the gas funnel 300. In some embodiments, the front surface 304 of the gas funnel 300 has an inverted funnel-like shape with a larger gap adjacent the central axis 201 of the funnel 300 than adjacent the front edge near the outer peripheral region.

The sidewalls 306 have an outer face 310 and an inner face 312. The outer face 310 of the sidewalls 306 contact the inner wall 304 of the pumping liner 200. The outer face 310 of the sidewalls 306 is in contact with the inner face 221 of the first baffle 220 and the inner face 231 of the second baffle 230 to form the outer boundary of the first plenum 223 and second plenum 225.

The gas funnel 300 has an opening 314 extending through the back surface 307 to the front surface 304. The opening 314 of some embodiments is symmetrical around a central axis of the gas funnel 300. In some embodiments, the opening 314 is adjacent the front surface 304 flares from a first diameter at the back surface 307 to a second diameter larger than the first diameter at the front surface 304. The diameter of the opening 314 of some embodiments remains substantially uniform (within ±0.1 mm) from the back surface 307 to a depth within the gas funnel 300 and then flares from the depth within the gas funnel 300 to the second diameter at the front surface 304, as illustrated in FIG. 3.

In some embodiments, the gas funnel 300 includes a plurality of apertures 320 extending from the front surface 304 to the back surface 307. The apertures 320 are spaced adjacent to the outer peripheral edge 316 of the front surface 304 of the gas funnel 300. In some embodiments, the apertures are angled inwardly so that the opening of the aperture 320 in the front surface 304 is further from the central axis 301 than the opening of the aperture 320 in the back surface 307. The number, size and spacing of apertures 320 in the gas funnel 300 can be varied. In some embodiments, there are greater than or equal to about 48 apertures 320 equally spaced around the outer peripheral region of the funnel 300.

In some embodiments, the process chamber lid 100 includes a liner heater 150. The liner heater 150 is positioned on the top wall 208 of the pumping liner 200. In some embodiments, the liner heater 150 comprises a plurality of separate segments spaced around the top wall 208 of the pumping liner 200. The embodiment illustrated in the Figures has four liner heater 150 segments. In some embodiments, there are two, three, four, five, six, seven or eight separate liner heater 150 segments.

In some embodiments, all of the liner heater 150 segments are controlled at the same time. In some embodiments, each of the segments is independently controlled.

In some embodiments, the liner heater 150 segments are separated by another component of the process chamber lid 100. In some embodiments, the liner heater 150 segments are separated from adjacent segments by an eye bolt 160 connected to the pumping liner 200. In some embodiments, there is the same number of eye bolts 160 as liner heater 150 segments.

Figure 4:
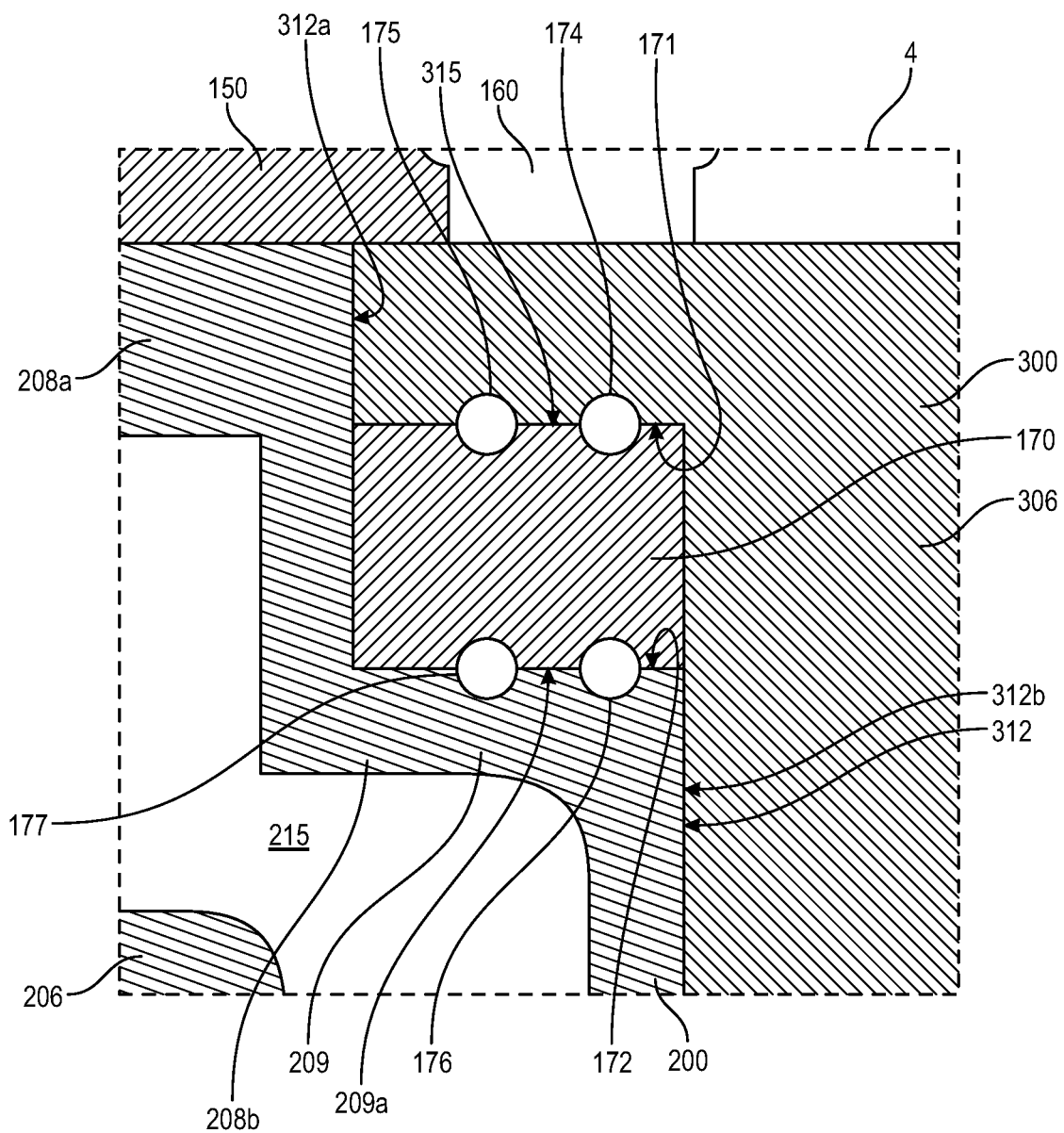
FIG. 4 is an expanded view of region 4 of FIG. 3.

FIG. 4 shows an expanded view of region 4 illustrated in FIG. 3. With reference to FIGS. 3 and 4, in some embodiments, the pumping liner 200 comprises an outer top wall 208a and an inner top wall 208b that form an inner ledge 209. The inner ledge 209 has a ledge surface 209a connecting the inner top wall 208b and the outer top wall 208a.

In some embodiments, as shown in the Figures, the outer wall 312 of the gas funnel 300 comprises a lower outer wall 312b and an upper outer wall 312a. The upper outer wall 312a extends further from the central axis 201 than the lower outer wall 312b. The lower outer wall 312b and the upper outer wall 312a are connected by a cantilever surface 315. In some embodiments, the cantilever surface 315 of the gas funnel 300 is positioned over the ledge 209a of the pumping liner 200. In some embodiments, the cantilever surface 315 of the gas funnel 300 is directly over the ledge 209a of the pumping liner 200. As used in this manner, the term "directly over" means that there are no intervening components other than O-rings separating the recited parts.

In some embodiments, the cantilever surface 315 is over the ledge 209a and spaced from the ledge 209 by a spacer ring 170. The spacer ring 170 has a top surface 171 and a bottom surface 172 defining a thickness of the spacer ring 170. The spacer ring 170 of some embodiments is positioned between the cantilever surface 315 of the gas funnel 300 and the ledge 209 of the pumping liner 200 so that the cantilever surface 315 is adjacent the top surface 171 of the spacer ring 172 and the ledge 209a is adjacent the bottom surface 172 of the spacer ring 170. In some embodiments, the spacer ring 170 is positioned directly between the cantilever surface 315 of the gas funnel 300 and the ledge 209 of the pumping liner 200 so that the cantilever surface 315 is adjacent the top surface 171 of the spacer ring 172 and the ledge 209a is adjacent the bottom surface 172 of the spacer ring 170. As used in this manner the term "directly between" means that there no intervening components other than O-rings between the recited components.

In some embodiments, an inner top surface O-ring 174 and an outer top surface O-ring 175 are positioned between and in direct contact with the top surface 171 of the spacer ring 170 and the cantilever surface 315 of the gas funnel 300. In some embodiments, an inner bottom surface O-ring 176 and an outer bottom surface O-ring 177 are positioned between and in direct contact with the bottom surface 172 of the spacer ring 170 and the ledge 209a of the pumping liner 200.

Figure 5:
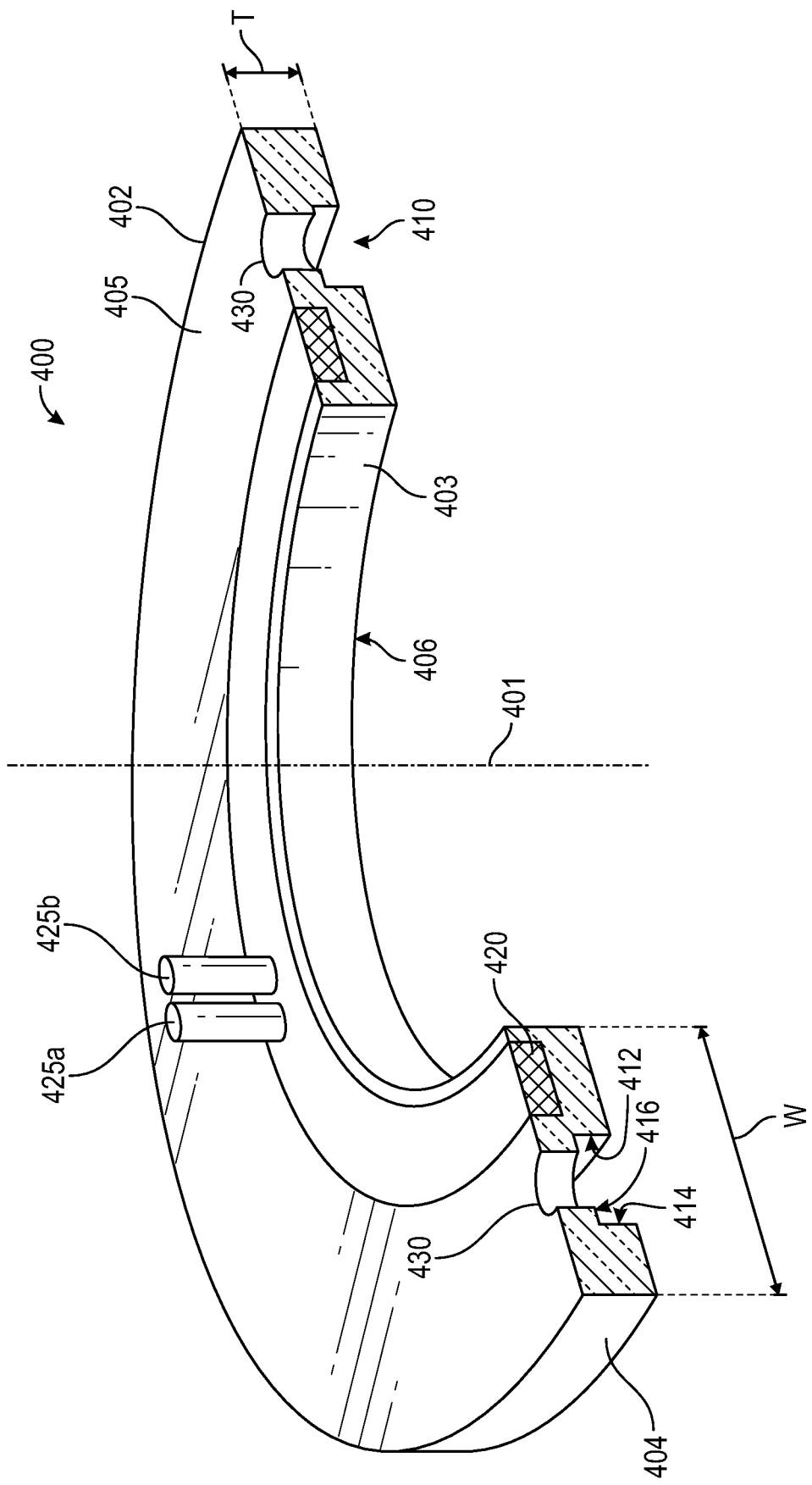
FIG. 5 is a cross-sectional isometric view of a purge ring according to one or more embodiment of the disclosure.

Referring to FIG. 5, some embodiments of the process chamber lid 100 include a purge ring 400. The purge ring 400 of some embodiments is positioned within the open central region 260 of the pumping liner 100. The bottom surface 406 of the purge ring 400 of some embodiments is in contact with the back surface 307 of the gas funnel 300. As used in this manner, the term "in contact with" means that the components are physically touching, or are close enough to form a fluid tight seal, for example, using one or more O-rings.

Referring to FIG. 5, some embodiments of the process chamber lid 100 include a purge ring 400. The purge ring 400 has a ring shaped body 402 extending around a central axis 401. The body 402 has an inner peripheral edge 403, an outer peripheral edge 404, a top surface 405 and a bottom surface 406. Inner peripheral edge 403 and outer peripheral edge 404 define a width W of the body 402 and the top surface 405 and bottom surface 406 define a thickness T of the body 402.

A circular channel 410 is formed in the bottom surface 406 of the body 402. The channel 410 has an inner peripheral edge 412, an outer peripheral edge 414 and a top surface 416. The channel 410 illustrated has a generally rectangular shaped cross-section. The disclosure is not limited to rectangular shaped cross-sectional channels 410. In some embodiments, the channel 410 is ovoid shaped or shaped without a hard corner. At least one opening 430 forms a fluid connection between the channel 410 and the top surface 416 to allow a flow of gas (or vacuum) to pass between the channel 410 and a component adjacent the top surface 416.

In some embodiments, a thermal element 420 is within the body 402. In some embodiments, as illustrated, the thermal element 420 is formed in the top surface 405 of the body 402. In some embodiments, the thermal element 420 is formed within the thickness of the body 402 so that the thermal element is not exposed through the top surface 405 or the bottom surface 406. In some embodiments the thermal element 420 is positioned closer to the central axis 401 of the body 402 than the circular channel 410, as illustrated in FIG. 5. In some embodiments, connections 425a, 425b are connected to the thermal element 420. The connections 425a, 425b can be any suitable connection depending on the type of thermal element 420. For example, for a resistive heater, the connections 425a, 425b of some embodiments are electrodes.

In some embodiments, the thermal element 420 is a part of the purge ring 400. In some embodiments, the thermal element 420 is a separate component from the purge ring 400.

Referring to FIGS. 1 and 2, some embodiments of the disclosure further comprise a thermal element 440 positioned adjacent the back surface 307 of the gas funnel 300. In some embodiments, the thermal element 440 is positioned adjacent to or embedded within the back surface of the gas funnel 300 adjacent the outer peripheral edge of the back surface of the gas funnel 300. In some embodiments, the thermal element 440 is a cooling element. The thermal element 440 of some embodiments includes a first connection 441 and a second connection 442. The first connection 441 and second connection 442 can be any suitable connection type depending on the type of cooling element. For example, the first connection 441 and second connection 442 in some embodiments are electrical connections, or are hollow tubes to allow a fluid to flow through the thermal element 440.

In some embodiments, the spacing between the gas funnel 300 and the blocker plate 350, and between the blocker plate 350 and the showerhead 280 are controlled to change the mixing dynamics of gas(es) flowing through the process chamber lid 100. In some embodiments, the funnel gap 308 forms a plenum to distribute gases flowing through the inlet 313 of the gas funnel 300, out the opening 314 in the front surface 304 of the gas funnel 300 and into the plenum formed by the funnel gap 308. Inside the funnel gap 308, the gases flow laterally across the back surface 354 of the blocker plate 350 to fill the funnel gap 308.

In one or more embodiments, the apertures 356 through the blocker plate 350 vary in size from the center of the blocker plate 350 to the outer peripheral edge of the blocker plate 350. In some embodiments, the diameters of the apertures 356 increase from the center to the outer edge of the blocker plate. The varied diameters promote the lateral flow diffusion of the gases to fill the funnel gap 308.

In some embodiments, the blocker distance $D_B$ is sufficiently small to substantially prevent lateral diffusion of the gases between the blocker plate 350 and the showerhead 280. In some embodiments, the apertures 288 in the showerhead 280 are substantially uniform in size across the surface of the showerhead.

Referring to FIG. 3, some embodiments further comprise a gas inlet 470 connected to, or directly connected to, the back surface 307 of the gas funnel 300. As used in this manner, the gas inlet 470 comprises one or more components configured to provide a flow of gas to the gas funnel 300. The gas inlet 470 provides fluid communication between the gas inlet 470 and the inlet 313 through and the opening 314 in the front surface 304 of the gas funnel 300.

The gas inlet 470 of some embodiments is connected to gas inlet 500 which includes a valve 510 in accordance with one or more embodiment of the disclosure. The valve 510 is also referred to as a dead volume-free valve. The valve 510 has a first inlet line 520 that passes through the body of the valve. The first inlet line has an upstream end 522 and a downstream end 524 that define the length of the first leg 520.

The gas inlet 500 includes a second inlet line 530. The second inlet line 530 has an upstream end 532 and a downstream end 534 defining a length of the second inlet line 530. The shape of the inlet lines can be varied and the length is measured from the center of the flow path of the lines.

The first inlet line 520 and the second inlet line 530 join at junction 525. The downstream end 534 of the second inlet line 530 connects with the first inlet line 520 at the junction 525. The junction of some embodiments is located along the length of the first inlet line 520. Stated differently, the junction 525 is located a distance from the upstream end 522 of the first inlet line 520 and a distance from the downstream end 524 of the first inlet line 520. The distances from the ends can be the same or different. In some embodiments, the junction is in the range of 25% to 75% of the length of the first inlet line 520.

The valve 510 includes a sealing surface 540 positioned along the length of the second inlet line 530. The sealing surface 540 is configured to separate the first inlet line 520 and the second inlet line 530 to prevent fluid communication between the first inlet line 520 and the second inlet line 530 upstream of the sealing surface 540. Stated differently, in some embodiments, the second inlet line 530 has a valve 510 configured to allow a flow of gas downstream only. The sealing surface 540 can be made of any suitable material that is compatible with the chemistries to be flowed through the first inlet line 520 and the second inlet line 530. In some embodiments, the sealing surface 540 comprises a check valve. The valve 510 of the illustrated embodiment comprises a ball valve in which the sealing surface 540 covers the inlet end of the valve when no or insufficient flow occurs through the second inlet line 530. The sealing surface 540 ball moves upon sufficient flow to allow fluid communication to occur from the upstream end to the downstream end of the valve.

In some embodiments, there is no dead volume in the valve 510. Dead volume is space which a gas can form eddies and become stuck so that after flow is stopped some of that gaseous species remains and can be added to the next gas flow.

While two inlet lines are illustrated in FIG. 3, the skilled artisan will recognize that more than two inlet lines are within the scope of the disclosure. For example, the valve can have a third inlet line (not shown) connecting to the first inlet line 520 or the second inlet line 530 at a second junction (not shown). In some embodiments, the third inlet line connects to the first inlet line 520 at the same junction 525 as the second inlet line 530.

FIG. 5 illustrates an embodiment which includes an optional remote plasma source 550. In some embodiments, the remote plasma source 550 is connected to the second inlet line 530 or the valve 510 to flow a plasma into the first inlet line 520 at junction 525. In some embodiments, the remote plasma source (RPS) 550 is between the downstream end 524 of the first inlet line 520 and the gas funnel 300. The remote plasma source 550 can be any suitable plasma source known to the skilled artisan. Suitable sources include, but are not limited to, capacitively coupled plasma (CCP) sources, inductively coupled plasma (ICP) sources, microwave plasma sources.

In some embodiments, even though the valve 510 is along the length of the second inlet line 530, the valve 510 is isolated from the second inlet line 530 by an isolation block 560. The isolation block 560 can be any suitable material that can separate the valve 510 from the second inlet line 530 to allow a plasma to be ignited within the valve 510 and not travel upstream along the second inlet line 530.

Referring back to FIG. 2, some embodiments include a controller 590 coupled to various components of the process chamber lid 100 to control the operation thereof. The controller 590 of some embodiments controls the entire processing chamber (not shown). In some embodiments, the processing platform includes multiple controllers, of which controller 590 is a part; each controller configured to control one or more individual portions of the processing platform. For example, the processing platform of some embodiments comprises separate controllers for one or more of the individual processing chambers, central transfer station, factory interface and/or robots.

In some embodiments, at least one controller 590 is coupled to one or more of the process chamber lid 100, liner heater 150, one or more flow controller, pressure gauge, pump, feedback circuit, plasma source 550, purge ring 400, thermal element 440, or other component used for the operation of the processing chamber or process chamber lid 100, as the skilled artisan will understand.

The controller 590 may be one of any form of general-purpose computer processor, microcontroller, microprocessor, etc., that can be used in an industrial setting for controlling various chambers and sub-processors. The at least one controller 590 of some embodiments has a processor 592, a memory 594 coupled to the processor 592, input/output devices 596 coupled to the processor 592, and support circuits 598 to communication between the different electronic components. The memory 594 of some embodiments includes one or more of transitory memory (e.g., random access memory) and non-transitory memory (e.g., storage).

The memory 594, or a computer-readable medium, of the processor may be one or more of readily available memory such as random access memory (RAM), read-only memory (ROM), floppy disk, hard disk, or any other form of digital storage, local or remote. The memory 594 can retain an instruction set that is operable by the processor 592 to control parameters and components of the system. The support circuits 598 are coupled to the processor 592 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Some embodiments of the disclosure are directed to process chamber lids 100 and methods of processing using the process chamber lid 100 as described herein. Some embodiments of the disclosure are directed to controllers 590 having one or more configurations to execute individual processes or sub-processes to perform embodiments of the method described herein. The controller 590 can be connected to and configured to operate intermediate components to perform the functions of the methods. For example, the controller 590 of some embodiments is connected to (directly or indirectly) and configured to control one or more of gas valves, actuators, motors, access ports, vacuum control, etc. Some embodiments are directed to non-transitory computer readable medium configured to execute embodiments of the method.

In some embodiments, the controller 90, or non-transitory computer readable medium, has one or more configurations or instructions selected from: a configuration to flow a gas through a first inlet line; a configuration to flow a gas through a second inlet line connected to the first inlet line through a valve configured to allow a flow of gas downstream only; a configuration to ignite a plasma in the second inlet line; and a configuration to power a liner heater to control a temperature in a pump liner.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A processing method comprising: flowing a first gas through a first inlet line into a gas funnel; flowing a second gas through a second inlet line connected to the first inlet line upstream of the gas funnel, the second gas flowing through a valve configured to allow a flow of gas downstream only; igniting a plasma of the second gas; exhausting gases through a pump liner; wherein the pump liner comprises a body having an inner wall, an outer wall, a top wall and a bottom wall, the body having a lower portion and an upper portion, the inner wall extending around a central axis spaced a first distance from the central axis forming an open central region; and powering a liner heater to control a temperature in the pump liner, wherein the liner heater comprises a plurality of separate segments spaced around the top wall of the pump liner wherein each of the segments is independently controlled.

2. The processing method of claim 1, wherein the top wall of the pump liner comprises an outer top wall and an inner top wall, the inner top wall forming an inner ledge having a ledge surface connecting the inner top wall and the outer top wall.

3. The processing method of claim 1, wherein the gas funnel has a front surface, a back surface, an outer wall and an inner wall, the front surface spaced a funnel distance from the back surface of a blocker plate to form a funnel gap, the gas funnel having an opening extending through the back surface to the front surface.

4. The processing method of claim 3, wherein the outer wall of the gas funnel comprises a lower outer wall and an upper outer wall connected by a cantilever surface.

5. The processing method of claim 4, further comprising positioning the cantilever surface of the gas funnel over the inner ledge of the pump liner.

6. The processing method of claim 5, further comprising positioning a spacer ring between the cantilever surface of the gas funnel and the inner ledge of the pumping liner so that the cantilever surface of the gas funnel is adjacent a top surface of the spacer ring and the inner ledge of the pumping liner is adjacent a bottom surface of the spacer ring.

7. The processing method of claim 6, further comprising positioning an inner top surface O-ring and an outer top surface O-ring between and in contact with the top surface of the spacer ring and the cantilever surface of the gas funnel.

8. The processing method of claim 6, further comprising positioning an inner bottom surface O-ring and an outer bottom surface O-ring between and in contact with the bottom surface of the spacer ring and the inner ledge of the pumping liner.

9. The processing method of claim 3, further comprising positioning a purge ring within the open central region of the pump liner such that a bottom surface of the purge ring is in contact with the back surface of the gas funnel.

10. The processing method of claim 9, wherein the purge ring comprises:
    a ring-shaped body with a central axis, an inner peripheral edge and an outer peripheral edge defining a width of the purge ring, and a top surface and the bottom surface defining a thickness of the ring-shaped body;
    a circular channel formed in the bottom surface of the ring-shaped body, the circular channel having an inner peripheral edge, an outer peripheral edge and a top surface; and
    at least one opening extending from the top surface of the body to the top surface of the circular channel, wherein the circular channel is aligned with a plurality of apertures formed in the gas funnel, the plurality of apertures extending through the gas funnel to the front surface of the gas funnel near an outer peripheral edge of the gas funnel.

11. The processing method of claim 10, wherein ring-shaped body of the purge ring further comprises a thermal element positioned closer to the central axis of the ring-shaped body than the circular channel.

12. The processing method of claim 10, further comprising positioning a thermal element adjacent the back surface of the gas funnel adjacent the outer peripheral edge of the back surface of the gas funnel.

13. The processing method of claim 10, wherein a plurality of apertures in the blocker plate gradually increase in diameter from a center of the blocker plate to an outer edge of the blocker plate.

14. The processing method of claim 3, further comprising connecting a gas inlet to the back surface of the gas funnel and providing fluid communication between the gas inlet and the first inlet line through the opening in the back surface of the gas funnel.

15. The processing method of claim 1, wherein the method comprises separating each of the segments is from adjacent segments by an eye bolt connected to the pump liner.

* * * * *

UNITED STATES PATENT AND TRADEMARK OFFICE
CERTIFICATE OF CORRECTION

| | |
|---|---|
| PATENT NO. | : 11,732,358 B2 |
| APPLICATION NO. | : 17/889930 |
| DATED | : August 22, 2023 |
| INVENTOR(S) | : Muhannad Mustafa et al. |

It is certified that error appears in the above-identified patent and that said Letters Patent is hereby corrected as shown below:

On the Title Page

•Page 2, Column 1, in "References cited", Under "U.S. PATENT DOCUMENTS", Line 19, replace "Petti" after "4/2015" and before "..........C23C 16/45565" with "Pettinger".

•Page 2, Column 1, in "References cited", Under "U.S. PATENT DOCUMENTS", Line 26, replace "Petti" after "2/2018" and before "..........C23C 16/4557" with "Pettinger".

•Page 2, Column 1, in "References cited", Under "U.S. PATENT DOCUMENTS", Line 30, replace "Petti" after "11/2020" and before "..........H01J 37/32532" with "Pettinger".

•Page 2, Column 2, in "References cited", Under "U.S. PATENT DOCUMENTS", Line 38, replace "Petti" after "7/2015" and before "..........C23C 16/4557" with "Pettinger".

In the Specification

•Column 5, Line 43, replace "DF" after "distance" and before "from the back" with "$D_F$".

Signed and Sealed this
Nineteenth Day of September, 2023

Katherine Kelly Vidal
*Director of the United States Patent and Trademark Office*